United States Patent [19]
Shilling et al.

[11] 4,245,261
[45] Jan. 13, 1981

[54] DIGITAL DISPLACEMENT TRANSDUCER AND METHOD FOR MEASUREMENT

[75] Inventors: Jack W. Shilling, Monroeville, Pa.; Jeffrey A. Dierker, Longwood, Fla.; Chester A. Mitchell, Worthington, Ohio

[73] Assignee: Allegheny Ludlum Steel Corporation, Pittsburgh, Pa.

[21] Appl. No.: 852,136

[22] Filed: Nov. 16, 1977

[51] Int. Cl.³ .......................... G11B 5/86; G11B 5/78
[52] U.S. Cl. ...................................... 360/17; 360/134
[58] Field of Search .................... 365/97, 131, 133; 360/15, 17, 111–115, 134

[56] References Cited

U.S. PATENT DOCUMENTS

| | | | |
|---|---|---|---|
| 3,125,743 | 3/1964 | Pohm et al. | 365/131 |
| 3,165,722 | 1/1965 | Ghisler | 360/15 |
| 3,302,190 | 1/1967 | Boylan et al. | 365/95 |
| 3,341,854 | 9/1967 | Supernowicz | 360/17 |
| 3,423,742 | 1/1969 | Harris | 360/111 |
| 3,438,010 | 4/1969 | Fuller | 365/133 |
| 3,456,250 | 7/1969 | Barcaro et al. | 360/111 |
| 3,479,156 | 11/1969 | Ginder | 365/131 |
| 3,487,388 | 12/1969 | Camp | 360/111 |
| 3,564,516 | 2/1971 | Janisch et al. | 365/97 |
| 3,626,396 | 12/1971 | Eastman et al. | 360/125 |
| 3,982,276 | 9/1976 | Roos | 360/17 |
| 4,079,360 | 3/1978 | Ookubz et al. | 365/95 |

Primary Examiner—Vincent P. Canney
Attorney, Agent, or Firm—Vincent G. Gioia; John K. Williamson

[57] ABSTRACT

A digital displacement transducer to provide a digital output linear related to the displacement of a reference surface of an object. An eight track tape unit is coded with information related to displacements of 1/256 of an inch and applied to the reference surface. Means are then provided to assume the coded information of the tape unit; the means are of lesser coercivity than the tape unit. The information means is pulsed so that the information contained is the same, and a read out head is provided to read out which information was shifted, and thereby indicate the position of the reference surface of the object. A method is also provided to encode the information in the information means, switch the information therein, and obtain a read out.

10 Claims, 5 Drawing Figures

| Top View | End View | | Voltage Pulse | Read Out |
|---|---|---|---|---|
| − + −21 | + −41 | | X | 1 |
| + − −22 | − −42 | | − | 0 |
| + − −23 | − −43 | | − | 0 |
| − + −24 | + −44 | | X | 1 |
| − + −25 | + −45 | | X | 1 |
| − + −26 | + −46 | | X | 1 |
| − + −27 | + −47 | | X | 1 |
| − + −28 | + −48 | | X | 1 |

20b  20a

DIGITAL DISPLACEMENT TRANSDUCER AND METHOD FOR MEASUREMENT

BACKGROUND OF THE INVENTION

This invention relates to a method of measuring d.c. flux and a device therefor.

More particularly, the invention is concerned with a method and a digital displacement transducer apparatus for the measurement of a digital output which is related to the linearly displacement of a reference surface of an object.

A device which provides a digital output related to the displacement of a surface is a digital displacement transducer. It is desired to provide such a transducer to measure spatial displacement of approximately 0.004 inches (1/256 of an inch) of surface. One manner of providing a digital output related to spatial displacement is to provide an eight track magnetic tape or equivalent magnetic sheet and attach the tape to a reference surface of the object. The position of the reference surface could then be ascertained by reading coded information on the magnetic tape. For this purpose a stationary head would be used to read the coded information. In order to read the tape, it would be necessary to use a Hall probe or other equivalent d.c. flux measuring device; it would have to be used in the stationary head. While this technique is useful, it is quite costly. Hall probes are expensive, and they require flux condensing as small d.c. fields must be read.

In order to overcome the aforesaid problems and reduce the costs, the present invention proposes two embodiments to provide for the non-destructive readout of the coded magnetic tape.

One embodiment is to provide a hard magnetic tape which is coded with magnetic information related to the displacement of a reference surface. A second soft magnetic tape is juxtaposed next to the hard magnetic tape and flux closed therewith. A magnetic field pulse is applied to the composite tape unit to change the magnetic stored information from a one or a positive state to a zero or negative state. The magnetic field has no effect on those already in the negative state. The magnetic field pulse is sufficiently strong to switch the information stored in the soft magnetic tape, but it is insufficient to switch the information stored in the hard magnetic tape. Therefore, the hard magnetic tape retains its coded information.

Another embodiment is to provide a single magnetic tape with coded information contained therein similar to the aforesaid hard magnetic tape. In this embodiment, the single tape also has eight tracks, although eight separate single track tapes can be used. A read head is provided for each track. Each read head includes a primary winding and a secondary winding. Use is made of the magnetic saturation characteristics of the read head to induce a large or small EMF into the secondary winding and provide a digital output.

BRIEF DESCRIPTION OF THE DRAWINGS

FIG. 1 also shows a magnetization means in the form of a magnetization head for one of the tapes and a readout coil. While FIG. 1 shows the magnetization means as the head, a single strand wire running perpendicular to the magnetic axis can also be used in place of the magnetization head as the magnetization means to magnetize the one of the tapes.

DETAILED DESCRIPTION OF THE INVENTION

Figures 1, 3:
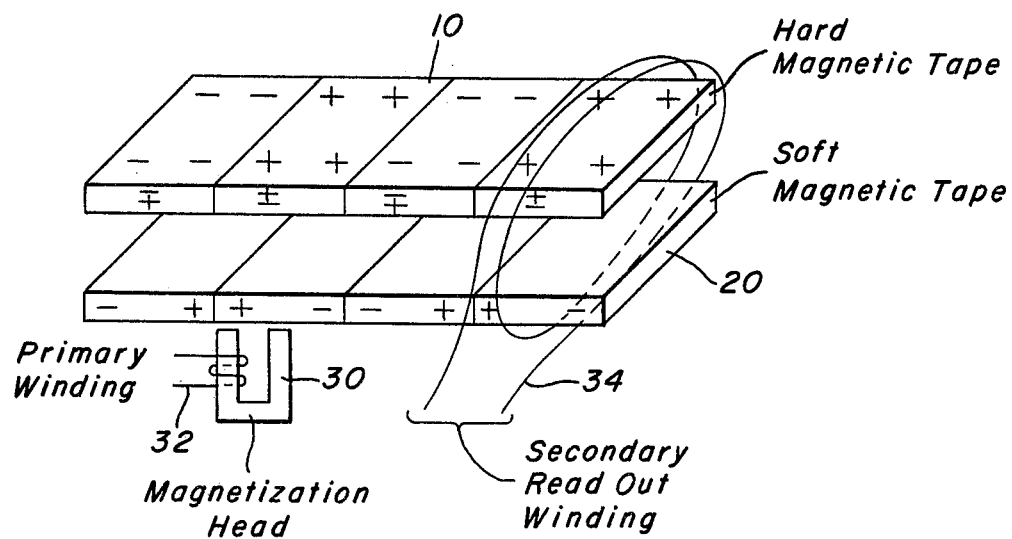
FIG. 1 is a schematic representation of one embodiment of the invention which uses two magnetic tapes, one overlying the other, which are adapted for attachment to a reference surface of an object.
FIG. 3 shows a composite view of one zone of the eight track tape. The composite view includes a top view and end view of the tape together with one column indicating the Voltage Pulse and a second column indicating the Read Out. The Read Out column indicates the occurrence "X" or lack of occurrence "—" of a voltage pulse noted in the column under voltage pulse, and indicates whether a voltage pulse is produced as a result of switching the tape. A readout voltage pulse is obtained from those tracks switched. The tracks switched are those with a positive sign.

Referring now to the drawings and more particularly to FIG. 1 of the drawings, a hard eight track magnetic tape 10 and soft magnetic tape 20 are shown. Tape 10 is shown with only a single track and containing stored information. Tape 10 is juxtaposed to and overlayed with soft eight track magnetic tape 20, also shown with only a single track. Tapes 10 and 20 are juxtaposed to each other so that the bits of stored information in tape 10 are flux closed by tape 20. It is understood that while only a single track is shown, the tapes contain eight tracks.

Figure 2:
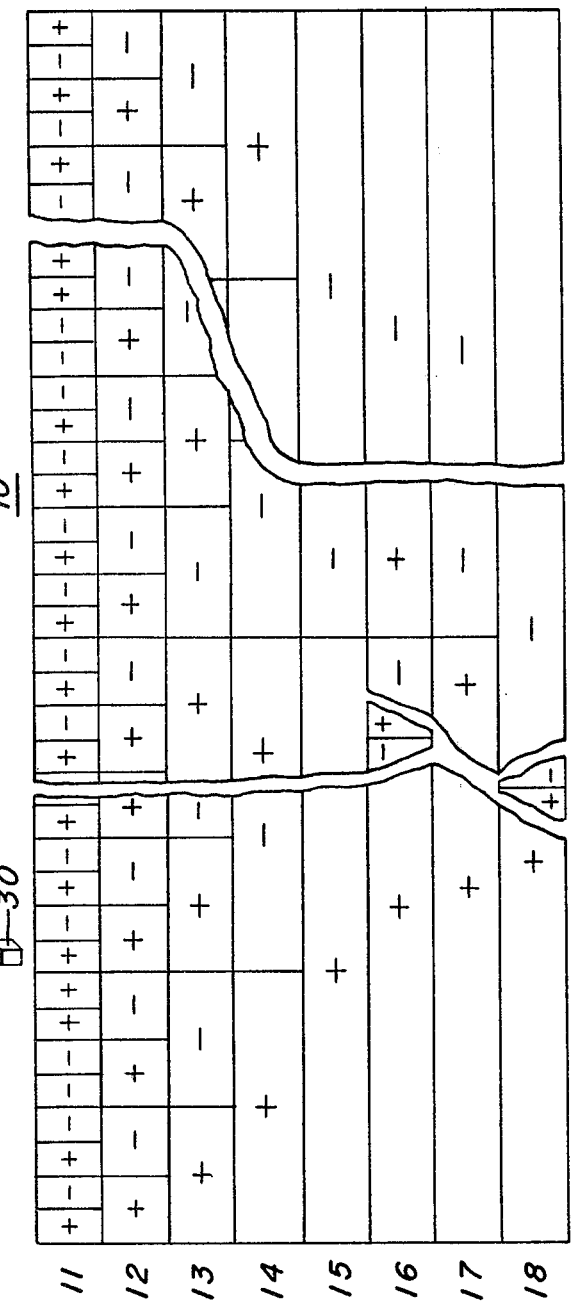
FIG. 2 shows a schematic representation of an eight track tape which has been magnetically coded with stored information.

Tape 10 is shown in FIG. 2 with all eight tracks 11, 12, 13, 14, 15, 16, 17 and 18 with the bits of stored information. Tape 20 after being juxtaposed to tape 10 and flux closed therewith assumes all of the information in tape 10 and therefore stores the same magnetic code. Tape 20 is shown with the eight tracks 21, 22, 23, 24, 25, 26, 27 and 28 in FIG. 3. An end view 20a and a top view 20b of tape 20 is shown in FIG. 3.

A magnetization means 30 shown in the form of a magnetization head having a primary winding 32 is placed onto one of the zones on tape 20, and the composite tape unit 10, 20 is provided with a readout means, which includes means, as schematically shown, a secondary winding 34 magnetically coupled with the composite tape unit. A separate secondary winding 34 is required for each track. Secondary winding 34 is helically wound about the composite tape unit 10, 20. The read out means can be in the form of a readout head. While magnetization means 30 is shown in the form of a magnetic head, it is also within the scope of the invention to use a single wire in lieu of the magnetization head. This single wire when pulsed with a current of critical magnitude can be used to switch the magnetization in the soft magnetic tape. This offers the advantage of being simpler and intrinsically smaller in size than a yoke-based "recording head".

It is to be understood that tape 10, coded as shown as in FIG. 2, is adapted for securement to a reference surface of an object (not shown). By this arrangement, relative linear displacement between the reference surface and the magnetization means 30 can be accurately sensed in the manner to be described hereinbelow.

By hard magnetic material as used herein, it is intended to designate a material which has a high coercive force and is hard to change its magnetization characteristic. Soft magnetic material as used herein is intended to designate a material which has a low coercive force and changes its magnetization characteristics easily.

Primary winding 32 when energized with a pulse is effective to switch the pulse (+) reading in tape 20 but ineffective to switch the (+) code in coded tape 10. Switching of tape 20 provides a voltage pulse in secondary winding 34. The column in FIG. 3 under voltage pulse indicates by means of an "X" that a voltage pulse is produced in the secondary winding as a result of switching of the tape. Column 2 indicates the read-out for the zone switched on tape 20 which corresponds to the zone on tape 10 under the recording head 30. As shown in FIG. 2 and as indicated in the column under read-out in FIG. 3, the position of the recording head is 10011111.

As noted heretofore, it is possible to use a single conductor as the magnetization means. Such a single conductor can be used to bridge all eight tracks and would normally lie perpendicular to the eight tracks. Such a conductor when pulsed with a current will generate a magnetic field along the tape axis and, depending upon the sign of the current will only switch "+" or "−" zones on tape 20. When the single conductor is used as the magnetization means, it can be generally similar to the secondary winding 34, and hence a separate drawing to show magnetization means 30 in the form of a single stand wire running perpendicular to the magnetic tape axis is considered to be unnecessary.

FIG. 3 shows separate conventional readout means in the form of heads 41, 42, 43, 44, 45, 46, 47 and 48 provided for each track. The readout heads may be mounted adjacent to or on the other side of the tape from the magnetization means or magnetization write head.

Figure 4:
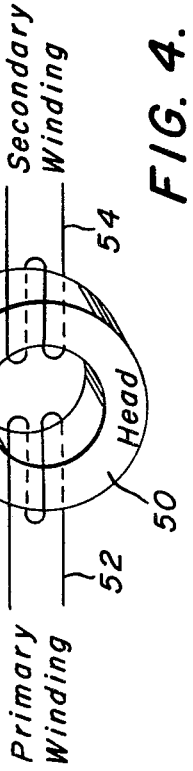
FIG. 4 is a schematic representation of another embodiment of the invention which uses only one magnetic tape with eight tracks or eight separate single track tapes and a magnetic read head for each track.

Referring now to FIG. 4 of the drawings which shows another preferred mode of practicing the invention, a portion of tape 10 is shown with a read head 50 having a primary input winding 52 and a secondary output winding 54. Tape 10 is preferably an eight track tape of the type shown in FIG. 2. Nevertheless, eight single track tapes can also be used. Tape 10 carries the magnetic coded information to indicate the location or position of the reference surface.

Read head 50 is constructed of non-linear high permeability magnetic material, but of a lesser covercive force than tape 10. Read head 50 is magnetized by the stored magnetization dipole in the tape 10. By suitably pulsing the primary winding 52 with a current that is adjusted in magnitude so it will be large enough to switch the head but less than that required to switch the tape, only the head 50 will be switched.

Figure 5:
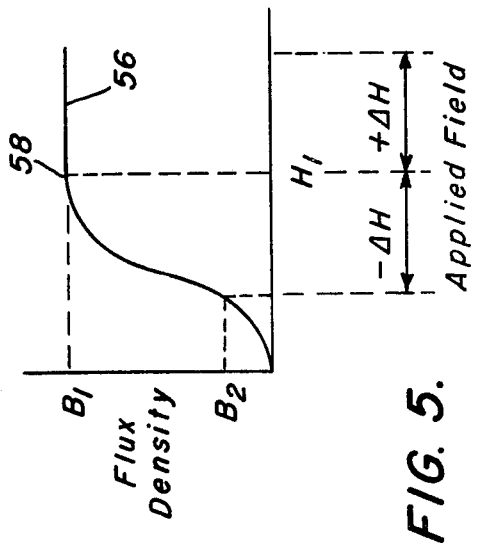
FIG. 5 is a graphical representation of the magnetization curve of the magnetic read head of FIG. 4.

The graphical representation of FIG. 5 which shows the magnetization curve 56 of magnetic read head 50 demonstrates the effect produced by the current applied to primary winding 52. The ordinate of the graph shows flux density and the abscissa shows the applied magnetic field. The magnetic field H, is induced into read head 50 by the flux B, produced by the dipole moment in tape 10. The read head 50 is magnetized by the tape to a near saturated condition just above the knee of the B-H curve. As a result of the current applied to primary winding 52, an applied field $-\Delta H$ or $+\Delta H$ will be produced depending on the current direction. Assuming the magnetization shown, field $+\Delta H$ will produce a small electromotive force (EMF) in secondary winding 54, and field $-\Delta H$ will produce a large EMF in secondary winding 54 and in the opposite direction to the EMF produced by the field $+\Delta H$. An output is produced in the secondary winding 54 when the head 50 is pulsed for demagnetization thereof.

OPERATION

The device described in FIGS. 1-3 operates in the following manner. When all eight tracks of each tape are in the position shown, and tape 10 is coded as indicated in FIG. 2, a magnetic field pulse which is sent through the single conductor (not shown, but explained heretofore) or primary winding 32 switches the small bits of information stored in tape 20, but not tape 10, if the bits in tape 20 are of opposite magnetic polarity to the sense of the magnetic field produced by head 30. These bits were arbitrarily labeled with a "+" in FIG. 3. Simultaneously, voltage pulses appear in the secondary coil at the ends of each composite tape track when a switching event has occurred. Tracks 21, 24, 25, 26, 27 and 28 which are labeled with a "+" are switched, and these tracks are designated with a "1" under the Read Out Column in FIG. 3. In tracks 22 and 23, no switching event takes place, and they are designated with an "0" in the Read Out Column in FIG. 3.

The secondary winding 30 detects the switching events. The switching events detected then produce a "1" in the read out as noted in column 2 of FIG. 3. Increased resolution is obtainable by using eight tracks in parallel.

The device shown in FIG. 4 operates on the same principle, but somewhat differently. In FIG. 4, only a single tape is used, and tape 20 of the FIG. 1 embodiment is omitted. A separate read head 50 together with primary winding 52 and secondary winding 54 are provided for each of the eight tracks or for each track of the eight separate tapes. The read heads are magnetized by the flux in the tape and are in the saturated condition of $-H$ or $H$, depending on the sense of magnetization in tape 10 underlying read head 50. If the primary winding is energized so that the magnetization $+\Delta H$ is applied, no switching takes place; but if the magnetization applied is $-\Delta H$, switching takes place as a result of an output in secondary winding 54. Since head 50 is saturated, $+\Delta H$ produces only a small EMF, while $-\Delta H$ produces a large EMF. As noted heretofore, head 50 must be a high permeability, non-linear magnetic material. In the normal device operation, the eight head system will be simultaneously pulsed and the eight secondary induced EMF's will read as 1,0 pulses depending on the sense of magnetization in the magnetic tape under each head.

The position of the tape 10 is directly related to the spatial position of the reference surface of the object. Each one of the separate 256 zones on track 11 corresponds to a different space representing the 1/256 of an inch spacing. When track 28 is coded with two bits of information, track 21 will be coded with 256 bits of information and the tracks 22 to 27 will be coded in accordance with conventional practice so that the adjacent tracks above track 28 will each successively include twice as many bits of information as the preceding track.

In the FIG. 1 embodiment, when a pulse is applied to primary winding 32, only some of the tracks of each zone will have their magnetization changed depending upon the system used. The system used herein is to change those tracks in the zone with a "+" to a "−". If the track is already magnetized "−", then no change takes place, and the output is zero.

In the FIG. 4 embodiment, it will be noted that the B-H magnetization curve for read head 50 begins its saturation area above the knee which occurs at 58 in FIG. 5. The magnetization H, or maximum coercive force to flux saturate head 50 occurs at the knee 58. Any increase in magnetizing force above the knee 58 produces no further flux saturation and no change in EMF; a reverse energization of head 50 by means of primary winding 52 produces a decrease in the applied field or coercive force and therefore a change in flux density from $B_1$ to $B_2$. The decrease in flux density from $B_1$ to $B_2$ produces a large EMF in secondary winding 56 and therefore an output voltage and current pulse therefrom.

It is possible to use a tape unit formed from a tape with eight separate tracks or eight separate tapes each having a single track.

When such a tape unit is coded with binary information in a manner shown for example in FIG. 2, there are a possible 256 unique binary combinations ($2^8$). If a one inch length of tape is utilized, each coded combination represents 1/256".

Thus it would be obvious to those skilled in the art, that the digital displacement transducer can be used to measure precise zone spacings of approximately 0.004 inch resolution. In effect, the tape unit 20 or the head 50 is shifted so that all the tracks of tape unit 20 or all the heads 50 contain the same information. After shifting so that all contain the same information, the output produced is characteristic of the original information.

It is also within the scope of this invention to increase the spatial resolution beyond 1/256 of an inch, where this should be necessary for a particular requirement. Accordingly, further spatial resolution may be obtained by increasing the number of tracks. For this purpose, separate tapes with individual tracks may be used, where tape units with nine or more tracks are required. While reference has been made to measurement in inches, any system of units may be used. What is important is that with the method and device of this invention, discrete spacings of a non-moving object can be measured with the accuracy required.

We claim:

1. A method of producing a digital output related to the linear displacement of a reference surface of an object, comprising:
   coupling a tape of hard magnetic material with magnetic coded information therein characteristic of the displacement of the reference surface of the object;
   juxtaposing a magnetic means with the tape in a flux closed position therewith, so that the magnetic means assumes the coded characteristic of the magnetic coded information of the tape, said magnetic means having two states of magnetization;
   pulsing said magnetic means to switch the magnetic means solely from one of the two states of magnetization; and,
   reading said magnetic means and providing an output indicative of switching events taking place in the magnetic means.

2. The method as set forth in claim 1, wherein:
   said juxtaposing step includes
   juxtaposing a second magnetic tape having the same number of tracks as the first-mentioned tape;
   said pulsing step includes applying a magnetic field pulse to each said track; and,
   said reading step includes encircling said first and second magnetic tapes with a helically wound secondary winding for each said track and recording the output of each of the secondary windings to indicate switching events.

3. The method as set forth in claim 1, wherein:
   said juxtaposing step includes juxtaposing a read head to each track of said tape, said read head being of non-linear magnetic material to flux close a zone on said tape containing stored information indicative of the spatial position of the reference surface;
   said pulsing step includes applying a primary winding to said read head to pulse said head to change the magnetic characterization thereof, said read head being magnetized by said tape to a near saturated condition just above the knee of the B-H curve; and,
   said reading step includes the step of providing a secondary winding to said read head to produce an output when said head is pulsed for demagnetization thereof.

4. The method as set forth in claim 3, wherein said tape is an eight track tape to provide a readout of a spatial resolution of 1/256 of an inch, and including the steps of:
   providing a tape unit including a plurality of tracks related to the spatial resolution of the contact surface, said tape being of hard magnetic material;
   coding said tracks with stored coded information to provide zones of spatial resolution related to the number of said plurality of tracks; and then,
   coupling said tape of hard magnetic material with the coded information therein to the object for displacement therewith.

5. A digital displacement transducer for providing a direct digital output related to the linear displacement of a reference surface of an object, comprising:
   tape means including a plurality of tracks, said tape means being coupled with said reference surface for displacement therewith, the number of said plurality of tracks being related to the spatial resolution of said reference surface, said tape means being of hard magnetic material and including stored bits of coded information characteristic of the spatial displacement along said reference surface;
   means juxtaposed to said tape means capable of being magnetized in accordance with the stored bits of coded information, said juxtaposed means being formed of magnetic material softer than said tape means;
   pulsing means operatively associated with said juxtaposed means to pulse said juxtaposed means to effect a change in said juxtaposed means of the coded bit stored information stored therein which are in a first state to switch solely the coded information in said juxtaposed means to a second state and to leave unswitched the coded bit stored information in said tape means; and,
   read out means operatively associated with said juxtaposed means and responsive to the switching of said juxtaposed means to provide a digital read out indicative of the spatial displacement of the reference surface.

6. The transducer as set forth in claim 5, wherein:

said tape means includes a first magnetically coded eight track tape having a spatial resolution of 1/256 of an inch (~0.004 inches); and, said juxtaposed means includes a second eight track tape flux closed with said first eight track tape, said second tape assuming the magnetically coded information of said first tape whereby to store the same magnetic coded information as in said first tape.

7. The transducer as set forth in claim 5, wherein:

said juxtaposed means includes a second tape means flux closed with said first tape means, said second tape means assuming the magnetic characteristics of said first tape means; and said first and said second tape means each include eight separate tapes, to provide a spatial resolution of 1/256 of an inch.

8. The transducer as set forth in claim 5, wherein:

said pulsing means includes a recording head and a primary winding coupled with said recording head for providing a voltage pulse solely strong enough to switch the coded information in said second tape, but insufficient to switch the coded information in said first tape;

said first and said second tapes forming a composite tape unit; and, said read out means includes a secondary winding helically wound about said composite tape unit responsive to switching events in said second tape, to provide voltage pulse outputs.

9. The transducer as set forth in claim 5, wherein:

said juxtaposed means includes a read head for each said tracks to read the zone coded information, said read head being of non-linear high permeability material, each said read head assuming the magnetization of its associated track zone, said head being magnetized to a point just above the knee of its B-H curve by said tape;

said pulsing means including a primary input winding coupled with said read head to produce an additional magnetic field in said read head;

said read out means including a secondary winding coupled with said read head responsive to said additional magnetic field to produce an output voltage when said additional magnetic field effectively causes the magnetization of said head to move below said knee and to produce no output voltage when said additional magnetic field causes the magnetization of said head to move about said knee.

10. A digital displacement transducer as set forth in claim 5, wherein said tape means includes:

a magnetically coded tape unit which includes eight separate tape tracks having a spatial zone resolution of 1/256 of an inch (~0.004").

* * * * *